United States Patent [19]

Yamamoto

[11] Patent Number: 5,408,589
[45] Date of Patent: Apr. 18, 1995

[54] PRINT DEVICE CAPABLE OF CONTROLLING INITIALIZATION OF A DATA STORAGE DEVICE

[75] Inventor: Ichiro Yamamoto, Nagoya, Japan

[73] Assignee: Brother Kogyo Kabushiki Kaisha, Nagoya, Japan

[21] Appl. No.: 901,849

[22] Filed: Jun. 22, 1992

[30] Foreign Application Priority Data

Jul. 16, 1991 [JP] Japan .................................. 3-175572

[51] Int. Cl.⁶ .............................................. G06F 3/12
[52] U.S. Cl. ...................................... 395/101; 395/115; 364/930; 364/DIG. 2
[58] Field of Search ......... 395/101, 115, 116, 162–166

[56] References Cited

U.S. PATENT DOCUMENTS 4,673,956 6/1987 Kobayashi .
5,040,022 8/1991 Kinoshita et al. .

FOREIGN PATENT DOCUMENTS 2287721 11/1990 Japan .

Primary Examiner—Robert L. Richardson
Attorney, Agent, or Firm—Oliff & Berridge

[57] ABSTRACT

A diagnosis mode start key provided on a switch panel is operated to execute a diagnosis mode processing routine for an external data storage device by a CPU of a laser printer. Then, the CPU determines whether initialization of the external data storage device, connected to the laser printer, has been completed. If the CPU determines that the initialization of the external data storage device has not been completed, a LCD displays a message "execute initialization?" and the CPU waits ready for a next instruction by a user. If a maintenance execution key is operated by the user, the LCD displays a message "initializing" during initialization. At the same time, an initialization execution processing is executed.

15 Claims, 4 Drawing Sheets

Fig. 3B

| HARD DISK DIAGNOSIS MODE PROCESSING ROUTINE | |
|---|---|
| S110 | INITIALIZATION COMPLETED? |
| S120 | DISPLAY "INITIALIZATION IS COMPLETED" |
| S130 | LCD DISPLAY PROCESSING "EXECUTE INITIALIZATION? |
| S140 | WHAT KEY IS OPERATED? |
| S150 | DISPLAY "CANCEL INITIALIZATION" |
| S160 | DISPLAY "INITIALIZING" |
| S170 | INITIALIZATION |
| S180 | INITIALIZATION SUCCESSFUL? |
| S190 | DISPLAY "INITIALIZATION IS COMPLETED" |
| S200 | DISPLAY "INITIALIZATION CANNOT BE EXECUTED" |

PRINT DEVICE CAPABLE OF CONTROLLING INITIALIZATION OF A DATA STORAGE DEVICE

BACKGROUND OF THE INVENTION

1. Field of the Invention

The invention relates to a print device capable of executing a print operation by sending and receiving data with a memory means.

2. Description of Related Art

There is known a page printer capable of printing using various styles of type by sending and receiving data and that has a hard disk for storing a plurality of fonts. The page printer reads the desired font data from the hard disk according to an input data from a host computer and executes a print operation. The maintenance of the hard disk, for example, an initialization and a recovery, is executed upon receipt of a command from the host computer as well as upon registration processing of the font data.

However, according to the above.-described printer, the hard disk cannot be maintained until the host computer is connected and is in the power-on state. Further, the host computer has a complicated operational mode because the host computer is used for not only maintenance of the hard disk but also various other functions. Therefore, there is a problem that it is troublesome for an user to execute the maintenance of the hard disk using the host computer.

SUMMARY OF THE INVENTION

It is therefore an object of the invention to provide a print device to which a memory means, such as a a data storage device having a removable disk memory, is connected such that the user can easily use the memory means.

The print device of the invention has a rewritable data storage device outside of the main body of the printer, the printer is capable of executing a print operation by sending and receiving data with the data storage device, comprises: a content diagnosis means for diagnosing a content of the data storage device according to predetermined rules; and a content rewriting means for rewriting the content of the data storage device into a specific content when it is diagnosed by the content diagnosis means that the content of the data storage device is not the specific content.

According to the above-mentioned structure, the content diagnosis means provided in the print device diagnoses the content of the data storage device according to predetermined rules. The content rewriting means rewrites the content of the data storage device into the specific content when it is diagnosed that the content of the data storage device is not the specific content by the content diagnosis means. For example, the content diagnosis means diagnoses the content of the data storage device. If the content diagnosis means detects a defective sector, the content rewriting means executes a processing so that the data to be written into the defective sector is written into a normal sector. As mentioned above, since the print device has a function of executing the maintenance of the data storage device, there is no need for the user to turn on or connect to a host computer and to operate the complicated host computer.

As described above, according to the print device of the invention, since the maintenance of the memory means, which is connected to or built into the print device, can be executed by the structure provided in the print device, there is no need for the user to activate and operate a complicated host computer. Therefore, the user can execute the maintenance of the removable hard disk without difficulty.

BRIEF DESCRIPTION OF THE DRAWINGS

A preferred embodiment of the invention will be described in detail with reference to the following figures wherein:

FIG. 3B is a table of labels for FIG. 3A.

DETAILED DESCRIPTION OF THE PREFERRED EMBODIMENT

Figure 1:
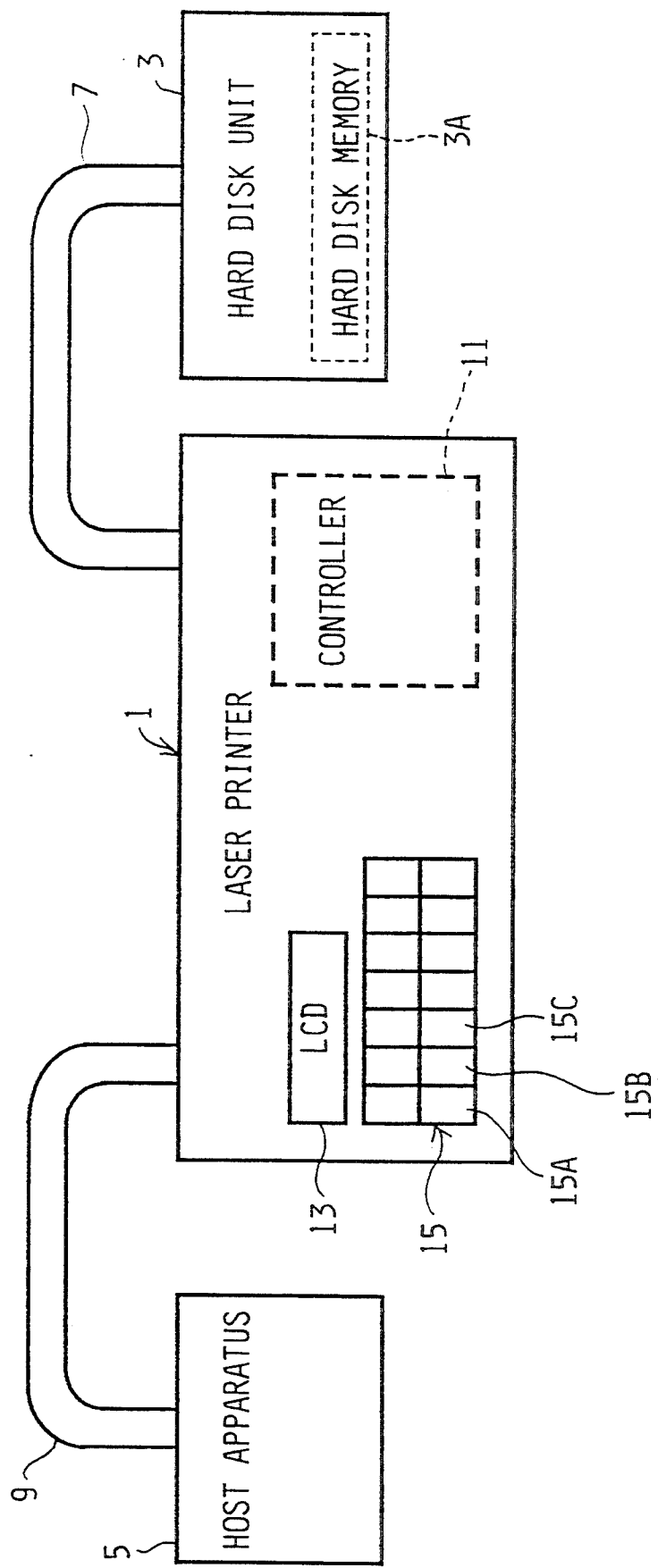
FIG. 1 is a block diagram showing a basic structure of one embodiment of the invention.

One embodiment of the invention will be explained using a laser printer. However, the invention is not restricted to a laser printer but may be used with other printers such as dot matrix, inkjet, line and impact. The laser printer used for this description is a kind of page printer capable of printing on a single page of printing paper. As shown in FIG. 1, a hard disk unit 3 and host apparatus 5 are independent outer devices and are detachably connected to the laser printer 1 through cables 7 and 9, respectively. The host apparatus 5 may be, for example, a personal computer for creating documents and executing data processing. A ROM 22, of a controller 11 provided in the laser printer 1 (FIG. 2), stores two preloaded programs. One program is for a conventional developing processing routine for creating image data developed in a bit map based on a character code input from the host apparatus 5. The other program corresponds to the hard disk diagnosis mode processing routine (FIG. 3). The ROM 22 also stores message data corresponding to messages for display on a liquid crystal display 13, which includes data for messages to be displayed during execution of the hard disk diagnosis mode processing routine. The liquid crystal display (LCD) 13 for displaying the messages and a switch panel 15 are provided on the laser printer 1. The switch panel 15 includes a diagnosis mode start key 15A for starting a mode that executes the diagnosis operation for the hard disk unit 3, a maintenance execution key 15B and cancel key 15C. The hard disk unit 3 has a removable hard disk memory 3A that stores font data corresponding to character shapes of various types, such as mincho letter and block letter.

Figure 2:
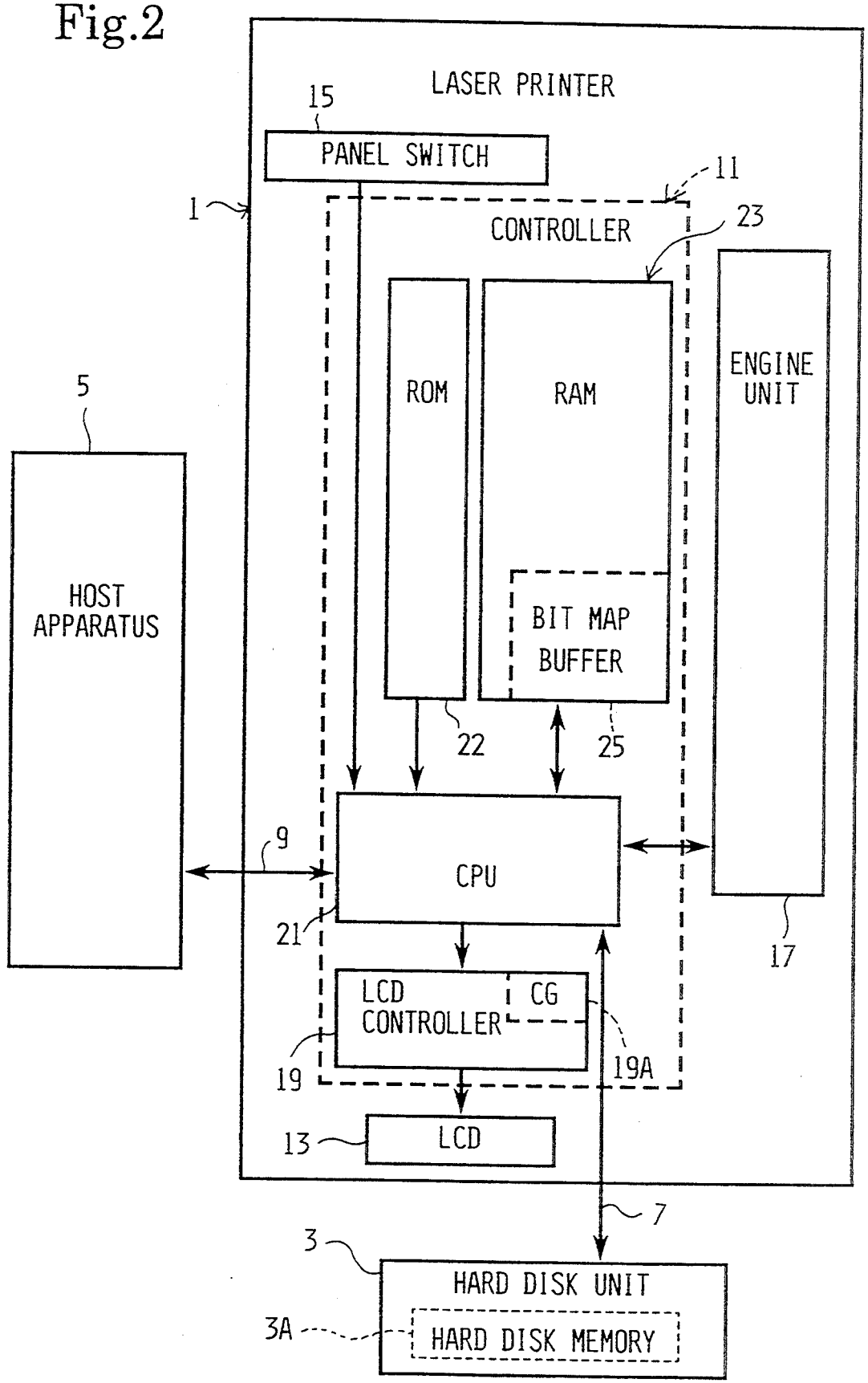
FIG. 2 is a block diagram of a laser printer showing one embodiment of the invention.

The structure of the laser printer 1 will be explained in detail with reference to FIG. 2.

The controller 11 is an arithmetic logic operation circuit which has a CPU 21, the ROM 22, a RAM 23 and a LCD controller 19. The LCD controller 19 includes a character generator (CG) 19A for generating a plurality of dot matrix patterns for various characters and drives the LCD 13 to display each message based on the dot matrix pattern. A host apparatus 5, for inputting data to be printed to the printer, the switch panel 15, the engine unit 17, and the hard disk unit 3 are connected to the CPU 21.

The controller 11 converts the character codes input from the host apparatus 5 into image data (which corresponds to print data) based on the font data stored in the hard disk unit 3 by executing the processing of the first program, and stores the image data in a bit map buffer 25 of the RAM 23. The image data for one page is stored in the bit map buffer 25 by being renewed sequentially.

The engine unit 17 has a known structure for printing an image on a print paper based on the input print data. This structure is similar to that of the laser printer disclosed, for example, in U.S. Pat. No. 5,040,022. The printing paper feeding, executed by the engine unit 17, is started by a request from the controller 11. However, the engine unit 17 does not synchronize with the controller 11. After starting the paper feeding, the engine unit 17 prints the image on the printing paper simultaneously with the feeding of paper based on the image data input from the controller 11 without synchronization with the controller 11. In the engine unit 17, the image is printed along the row direction which is the main scanning direction. When the image formation is completed at an end of one row, the image formation is started again from the head of the next row which is shifted in the paper feeding direction, namely a subscanning direction intersecting the main scanning direction.

The operation of the laser printer 1 will now be explained.

Figure 3A:
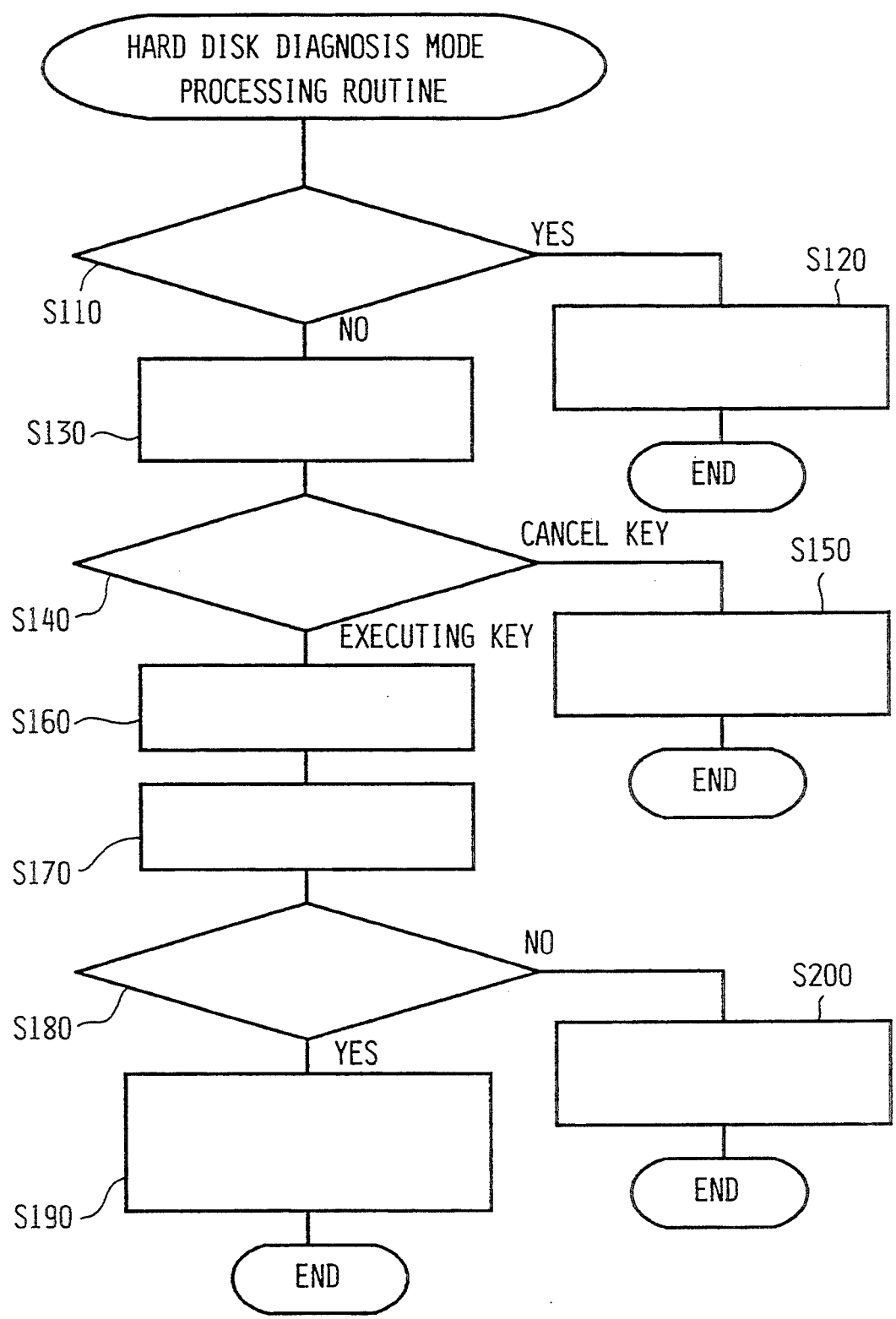
FIG. 3A is a flowchart showing a hard disk diagnosis mode processing routine to be executed in a computer of a page printer.

When the diagnosis mode start key 15A, of the switch panel 15, is operated, the operation is detected by a key scan executed by the CPU 21 of the controller 11 and the CPU 21 starts the hard disk diagnosis mode processing routine (See FIGS. 3A and 3B). When the routine is started, the CPU 21 determines whether the initialization of the hard disk memory 3A is completed (S110). This checking process is executed by inspecting whether a predetermined format data is correctly written in the hard disk memory 3A. If the CPU 21 determines that initialization of the hard disk memory 3A is completed (S110: YES), the CPU 21 executes a LCD display processing (S120) so that the LCD 13 displays a message "initialization is completed" and the routine is ended.

On the other hand, if the CPU 21 determines that initialization of the hard disk memory 3A has not been completed (S110), the CPU 21 executes the LCD display processing (S130) so that the LCD 13 displays a message "execute initialization?" and the routine proceeds to S140. In S140, the CPU 21 determines, by means of the key scan, whether either of the maintenance execution key 15B or the cancel key 15C, is operated. If the CPU 21 determines that the cancel key 15C is operated, the CPU 21 executes the LCD display processing (S150) so that the LCD 13 displays a message "cancel initialization" and the routine is ended.

If the CPU 21 determines that the maintenance execution key 15B is operated (S140), the CPU 21 executes the LCD display processing (S160) and the LCD 13 displays a message "initializing". At the same time, the CPU 21 commences the execution of initialization processing (S170). After the initialization processing has been completed (S170), the CPU 21 determines whether the initialization processing has been successful (S180). If the CPU 21 determines that the initialization processing has been successful (S180: YES), the CPU 21 executes the LCD display processing (S190) to have the LCD 13 display a message "initialization is completed" and the routine is ended. If the CPU 21 determines that the initialization processing has ended in a failure (S180: NO), the CPU 21 executes the LCD display processing (S200) so that the LCD 13 displays a message "initialization cannot be executed" and the routine is ended.

According to the laser printer 1 described above, the user can execute the initialization operation for the hard disk memory 3A by operating only switch panel 15 of the page printer 1. There is no need for the user to turn or to operate the complicated personal computer 5. Therefore, the user can execute maintenance of the hard disk unit 3 without trouble.

This invention is not limited to the above mentioned embodiment. It should be understood that many changes and modifications may be made in the embodiment without departing from the scope of the present invention. For instance, it may be used with any of the various memory devices capable of being rewritten on, such as a light disk and a magnetic tape. Further, it may be used with a memory device built into the print device. Further, other types of printers such as a line printer, dot matrix and ink jet printers can be used as a print device.

Further, in the above-described embodiment, the structure and process for the initialization of the hard disk memory 3A is explained. Similarly, other maintenance of the hard disk unit 3, for example, a recovery of the hard disk memory 3A and a check for detecting a defective sector, can be executed. For instance, programs for a recovery execution processing routine and a detection processing routine of a defective sector are stored beforehand in the ROM 22. Further, it may be possible that the check for detecting the recovery and the defective sector is executed when either routine is started by operating the switch panel 15. Likewise, it may be that a program of a print confirmation processing routine for printing the content of the hard disk memory 3A is stored beforehand in the ROM 22 of the computer 11. Then, when the print confirmation processing routine is executed by operation of the switch panel 15, the content of the hard disk memory 3A can be printed on a printing paper. That is, according to the above-mentioned construction, various information, such as the names of the styles of type (ex. mincho letter and block letter) of the font data stored in the hard disk unit 3, the capacity of the area where the data is stored, a use of the area, and an empty capacity, can be printed.

What is claimed is:

1. A print device for printing an image on a print medium on the basis of input data, comprising:
    an external data storage device for storing data by which a print operation is controlled;
    access means for writing and reading the data by accessing the external data storage device;
    print means for executing the print operation based on the data read from the external data storage device by the access means; and
    adjustment means for adjusting the state of the external data storage device to agree with predetermined format data by writing specific format data into the external data storage device.

2. The print device according to claim 1, further comprising diagnosis means for diagnosing whether the state of the external data storage device initially agrees with the predetermined format data which corresponds to a normal state of the external data storage device, said adjustment means adjusting the state of the external data storage device when the diagnosis means diagnoses that the state is different from the predetermined format data.

3. The print device according to claim 2, wherein the diagnosis means includes a determination means for determining whether the memory device is already initialized based on the predetermined format data, and the adjustment means includes an initialization means for initializing the external data storage device by writing the predetermined format data into the external data storage when the determination means determines the external data storage device is not initialized.

4. The print device according to claim 3, wherein the external data storage device includes a removable disk.

5. The print device according to claim 4, wherein the external data storage device is detachably connected to the print device.

6. The print device according to claim 4, wherein the removable disk stores font data corresponding to character shapes of various type styles.

7. The print device according to claim 4, wherein the print operation is executed on the basis of data input from an external host apparatus.

8. The print device according to claim 7, further comprising a display for informing the operator of the state diagnosed by the diagnosis means.

9. A print device for printing an image on a print medium on the basis of input data, comprising:
an external data storage device for storing font data for use in the print operation;
access means for writing and reading the data by accessing the external data storage device;
print means for executing the print operation using the font data read from the memory device by the access means; and
adjustment means for adjusting format data in the external data storage device to agree with predetermined format data, said adjustment means including an initialization means for initializing the external data storage device by writing the predetermined format data into the external data storage device, wherein the external data storage device includes a removable disk.

10. The print device according to claim 9, further comprising diagnosis means for diagnosing whether the format data of the external data storage device agrees with the predetermined format data which corresponds to a normal state of the external data storage device.

11. The print device according to claim 10, wherein the diagnosis means includes a determination means for determining whether the external data storage device is initialized based on the predetermined format data.

12. The print device according to claim 11, wherein said initialization means writes the predetermined format data into the external data storage device when the determination means determines the external data storage device is not initialized.

13. The print device according to claim 9, further comprising a display for informing the operator of the result of the determination by the determination means.

14. A print device for printing an image on a print medium by executing a print operation according to an input data, comprising:
an external data storage device for storing font data used in a print operation;
access means for writing and reading the data by accessing the external data storage device; and
print means for executing the print operation using the font data read from the external data storage device by the access means;
determination means for determining whether the external data storage device is already initialized based on predetermined format data; and
initialization means for initializing the external data storage device by writing the predetermined format data into the external data storage device when the determination means determines the external data storage device is not initialized, wherein the external data storage device includes a removable disk.

15. The print device according to claim 14, further comprising a display for informing the operator of the result of the determination by the determination means.

* * * * *